United States Patent [19]

Tompkins et al.

[11] 4,276,510
[45] Jun. 30, 1981

[54] APPARATUS FOR SENSING CURRENT TRANSFORMER PRIMARY CURRENT AS A FUNCTION OF DIFFERENTIAL CORE INDUCTANCE

[75] Inventors: Russell E. Tompkins, Scotia; John P. Walden, Schenectady, both of N.Y.; Loren H. Walker, Salem, Va.

[73] Assignee: General Electric Company, New York, N.Y.

[21] Appl. No.: 39,628

[22] Filed: May 16, 1979

[51] Int. Cl.³ .............................................. G01R 1/02
[52] U.S. Cl. ................................. 324/127; 324/117 R
[58] Field of Search ............... 324/127, 117 R, 117 H, 324/52, 55

[56] References Cited

U.S. PATENT DOCUMENTS

| | | | |
|---|---|---|---|
| 3,857,096 | 12/1974 | Gregory | 324/127 |
| 3,882,387 | 5/1975 | Vikstrom | 324/127 |
| 3,986,115 | 10/1976 | Huang | 324/127 |

*Primary Examiner*—David K. Moore
*Attorney, Agent, or Firm*—Robert A. Cahill; Walter C. Bernkopf; Philip L. Schlamp

[57] ABSTRACT

The secondary winding of a current transformer is driven by a high frequency AC source to excite the core to alternating, uniformly equal positive and negative peaks of current excitation. An inductance sensor alternately senses the secondary winding inductances at corresponding points adjacent the positive and negative peaks of the flux wave generated in the core. Any difference in these inductances is a function of low frequency primary current and is utilized to develop a current flowing through a tertiary core winding to equalize these inductances. This tertiary winding current thus becomes a precise measure of the primary current.

13 Claims, 5 Drawing Figures

APPARATUS FOR SENSING CURRENT TRANSFORMER PRIMARY CURRENT AS A FUNCTION OF DIFFERENTIAL CORE INDUCTANCE

BACKGROUND OF THE INVENTION

The present invention relates to sensing the magnitudes of low level primary currents in a current transformer, and particularly to sensing the magnitude of differential primary current in a differential current transformer as utilized in personnel ground fault protective devices.

To afford adequate personnel protection against the hazards of ground leakage current, ground fault protective devices must respond to differentials in the currents flowing in the line and neutral sides of a protected circuit of 5 milliamperes or more. Traditionally, a differential current transformer is utilized to sense when the 5 milliamp threshold is exceeded. Obviously, 5 milliamp net primary excitation is exceedingly small, and yet sufficient secondary signal must be developed for reliable processing by electronic circuitry pursuant to initiating a ground fault trip function. To achieve this, the differential transformer core must utilize relatively expensive materials, particularly in view of the compact sizes required for implementation in existing ground fault circuit interrupting (GFCI) devices, and the electronic signal processing circuitry must be of a sophisticated design having high signal gain capabilities and low susceptibility to noise. Furthermore, sensitivity to the typical 5 milliamp differential current trip threshold is highly dependent on the core characteristics, which, in turn, vary with temperature.

It is accordingly an object of the present invention to provide improved apparatus for accurately sensing current transformer primary current or differential primary current.

An additional object is to provide apparatus of the above character wherein the sensation of primary current is relatively unaffected by current transformer core characteristics.

Yet another object is to provide apparatus of the above character wherein the sensation of primary current is relatively unaffected by variations in core characteristics.

A further object is to provide apparatus of the above character which is capable of producing relatively large signal outputs indicative of primary current.

Other objects of the invention will in part be obvious and in part appear hereinafter.

SUMMARY OF THE INVENTION

In accordance with the present invention, there is provided a unique approach to sensing the magnitude of primary current excitation of a current transformer having particular, but not limited application to sensing differential primary current excitation of a differential current transformer of the type utilized in personnel ground fault protective devices. To this end, the present invention utilizes a high frequency AC source to drive a secondary winding of a current transformer with a square voltage wave. The duration of each positive and negative voltage is controlled so as to provide alternating positive and negative peaks of current excitation or magnetomotive force (MMF) of uniformly equal amplitudes. These peaks exceed the coercive level of the core, but fall short of driving the core into saturation. Thus, the peaks of the flux wave produced as the core is exercised by the AC source over a B-H operating loop occur in the regions of the core's B-H curve where the permeability of the core is beginning to decrease with increasing flux. The inductance of the secondary driving winding, being proportional to the slope of this B-H loop, varies as the core is exercised over the loop by the AC source. It has been found that for any soft magnetic core material, the slopes of the B-H loop, in the regions just before achievement of the positive and negative flux peaks are equal in the absence of low frequency or DC primary current excitation. However, in the presence of such primary current excitation, the B-H operating loop achieved by the high frequency AC driving source is shifted so as to no longer be symmetrical with respect to the relatively positive and negative core saturation levels of the core's B-H curve. Consequently, the core permeabilities, which are proportional to the secondary winding inductances, in the regions just before achievement of the positive and negative flux peaks are no longer equal and, in fact, differ as a function of the primary current excitation magnitude. Thus, in accordance with the present invention, inductance sensor means is utilized to sense any differential in these winding inductances pursuant to developing a signal proportional to the primary current excitation.

In the disclosed embodiment of the invention, voltages respectively proportional to the two inductance values are applied as separate inputs to a differential amplifier, which then operates to drive a feedback current through a tertiary current transformer winding automatically effective in counteracting the B-H operating loop shift produced by the primary current excitation in self-nulling fashion. The inductance differential is thus eliminated, and the voltages applied to the differential amplifier inputs become equal. The magnitude of the feedback current necessary to achieve this null or inductance equality thus becomes a precise measure of the primary current excitation, whether it be the current in a single primary winding or the differential in the primary currents flowing in a pair of primary windings.

The invention accordingly comprises the features of construction and arrangement of parts which will be exemplified in the construction hereinafter set forth, and the scope of the invention will be indicated in the claims.

For a better understanding of the nature and objects of the invention, reference should be had to the following detailed description taken in conjunction with the accompanying drawings, in which.

DETAILED DESCRIPTION

Figure 1:
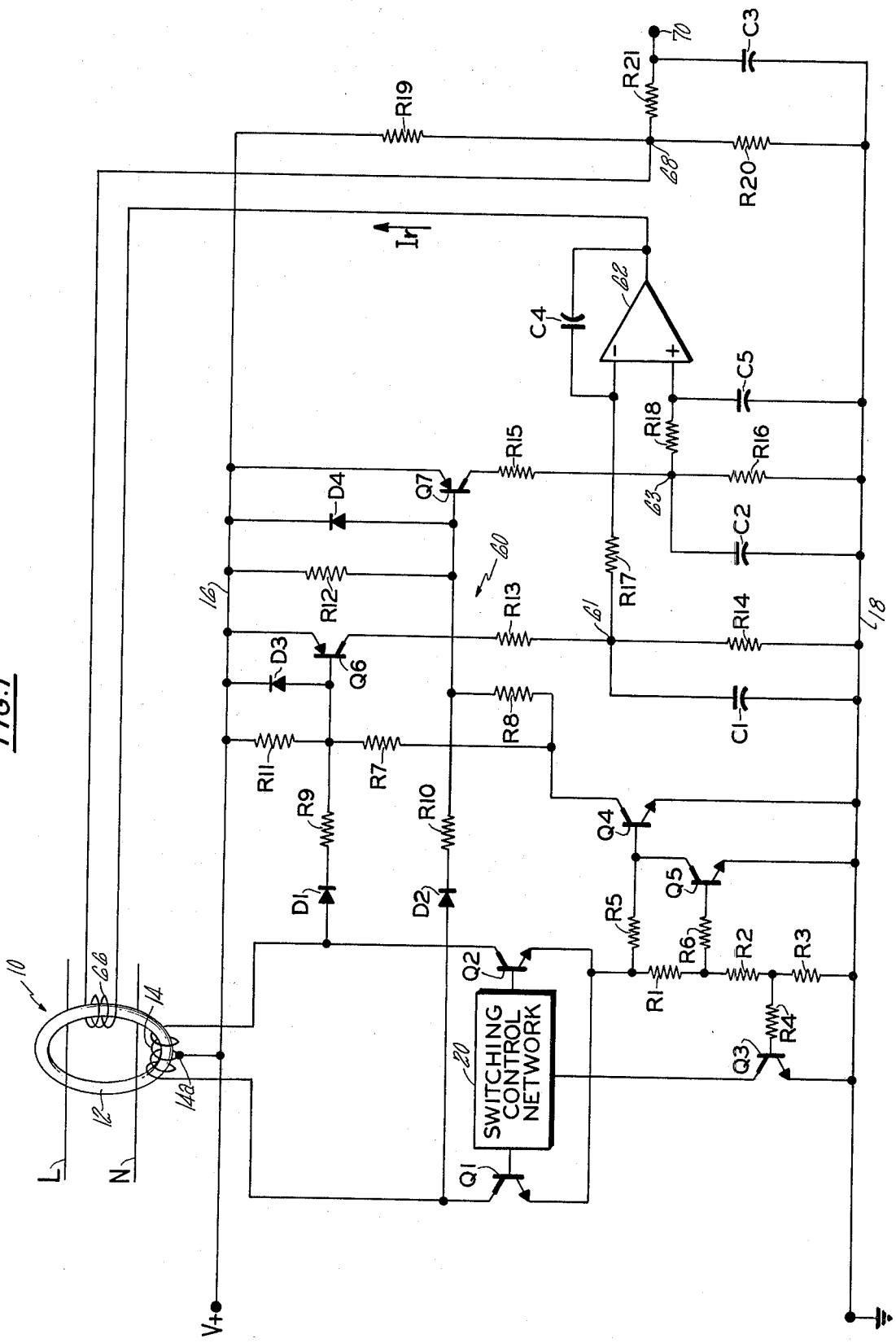
FIG. 1 is a circuit schematic diagram, partially in block diagram form, of an embodiment of the present invention.

The circuit embodiment of the present invention illustrated in FIG. 1 is implemented with a current transformer, specifically a differential current transformer, generally indicated at 10, having utility in personnel ground fault protective devices. Thus, transformer 10 includes a toroidal core 12 through which a line conductor L and a neutral conductor N of a protected circuit pass as separate, single-turn primary windings. Wound on this core is a multi-turn secondary winding 14, center-tapped at 14a. One end of this secondary winding is connected to the collector of a switching transistor Q1, while its other end is connected to the collector of a second switching transistor Q2. The center tap 14a is connected to a positive voltage bus 16 which, with ground bus 18, is connected to an appropriate supply voltage source. The bases of transistors Q1 and Q2 are connected to a switching control network 20 operating under the control of transistor Q3 to provide a peak current controlled inverter. For a detailed disclosure of inverters of this type, reference may be had to commonly assigned U.S. Pat. Nos. 3,781,638 and 4,071,812; the disclosures of which being specifically incorporated herein by reference. Basically, the switching control network 20 operates to alternately render transistors Q1 and Q2 conductive such that the supply voltage on bus 16 drives current through one half of secondary winding 14 and then the other half in alternating fashion. The emitters of transistors Q1 and Q2 are connected together such that their emitter currents flow to the ground bus 18 through a common voltage divider consisting of resistors R1, R2 and R3. The junction between resistors R2 and R3 is connected to the base of transistors Q3 through a resistor R4. The collector of transistor Q3 is connected to switching control network 20, while its emitter is connected to ground bus 18.

From the description thus far, it is seen that while switching control network 20 renders transistor Q1 conductive and transistor Q2 non-conductive, the supply voltage drives current through the left half of secondary winding 14, the collector-emitter circuit of transistor Q1 and the voltage divider (resistors R1, R2 and R3) to ground bus 18. When the voltage across resistor R3, developed by the transistor Q1 emitter current, rises to a level sufficient to forward bias transistor Q3, this transistor goes into conduction, causing switching control network 20 to switch transistor Q1 off and transistor Q2 on. The supply voltage then drives current through the right half of secondary winding 14, the collector-emitter circuit of transistor Q2 and the voltage divider to ground bus 18. When the voltage across resistor R3 again rises to the same level sufficient to turn transistor Q3 on, switching control network 20 switches transistor Q2 off and transistor Q1 on, thereby marking the end of one inverter cycle and the start of the next.

While FIG. 1 and the description thus far are in the context of a center-tapped secondary winding wherein current is driven through the two winding halves in alternating fashion, it will be understood that the present invention can utilize a switching transistor bridge consisting of four transistors, such as disclosed in FIG. 6 of above-noted U.S. Pat. No. 4,071,812, to alternately drive current through the full secondary winding in opposite directions.

Continuing with the description of FIG. 1, the upper end of resistor R1 is connected through a resistor R5 to the base of a transistor Q4, while the junction between resistors R1 and R2 are connected to the base of a transistor Q5 through a resistor R6. The emitters of transistors Q4 and Q5 are connected to ground bus 18, while the collector of transistor Q5 is connected to the base of transistor Q4. During each inverter half cycle, transistor Q4 is turned on when the voltage across the voltage divider (resistors R1, R2 and R3) rises to a level sufficient to forward bias its base-emitter junction. A short time later, the voltage at the junction of resistors R1 and R2 achieves a level sufficient to turn transistor Q5 on. The conduction of transistor Q5 shunts base drive current from transistor Q4, and this latter transistor turns off. Shortly thereafter, the inverter half cycle is concluded when the voltage at the junction of resistors R2 and R3 achieves the requisite level to drive transistor Q3 into conduction. As will be seen, transistors Q4 and Q5 function as an inductance sensor in that the interval of conduction of transistor Q4 during each inverter half cycle is indicative of the inductance of secondary winding 14.

Figure 4:
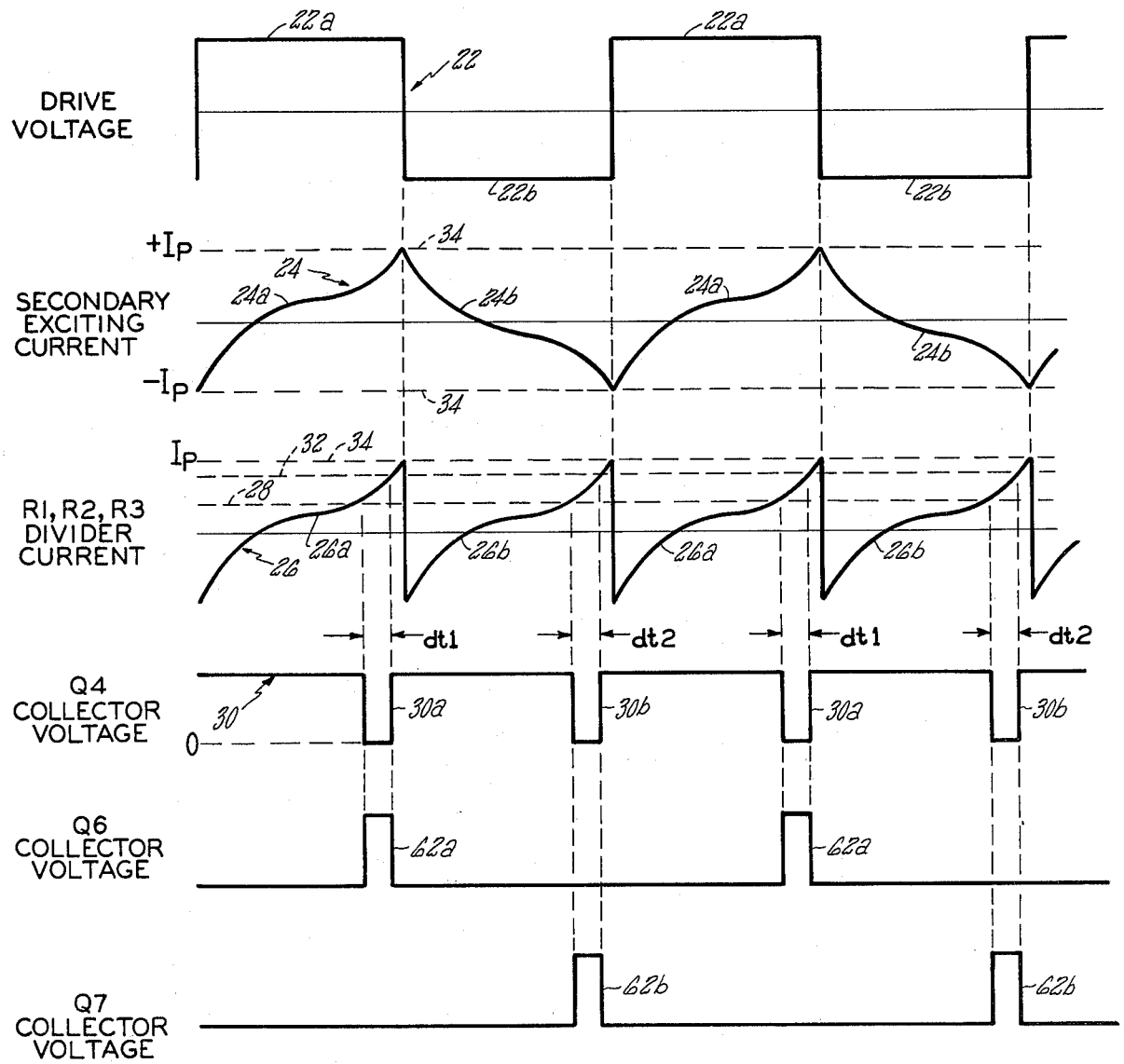
FIG. 4 is a series of voltage and current waveforms useful in understanding the operation of the circuit of FIG. 1 in the absence of primary current excitation.

Referring to FIG. 4, pulse wave 22 depicts the drive voltage applied to secondary winding 14 of FIG. 1, wherein pulses 22a represent the driving voltage for the right half of the secondary winding when transistor Q2 is on and transistor Q1 is off and pulses 22b represent the driving voltage for the left half thereof when transistor Q1 is on and transistor Q2 is off. Waveform 24 of FIG. 4 depicts the secondary winding exciting current, wherein curves 24a represent the current wave flowing through the right half of secondary winding 14 when transistor Q2 is on and curves 24b represent the current wave flowing through the left half thereof when transistor Q1 is on. Waveform 26 depicts the current flowing through the voltage divider (resistors R1, R2 and R3) of FIG. 1, wherein curves 26a represent the divider current originating from the emitter of transistor Q2 and curves 26b represent the divider current originating from the emitter of transistor Q1. During each inverter half cycle when the divider current rises to level 28, transistor Q4 is turned on, and its collector voltage goes to ground potential as represented by the Q4 collector voltage pulse wave 30 in FIG. 4. The divider current then achieves level 32, whereupon transistor Q5 turns on, forcing transistor Q4 off. The collector of transistor Q4 goes to a positive voltage to thus produce a pulse 30a during one inverter half cycle and a pulse 30b during the other half cycle. When the divider current achieves level 34, transistor Q3 turns on to conclude one inverter half cycle and initiate the other half cycle. The interval required for the divider current to rise from current level 28 to current level 32 during one inverter half cycle is designated dt1 and determines the width of pulses 30a, while, in the other inverter half cycle, the corresponding interval dt2 determines the width of pulses 30b.

Figure 2:
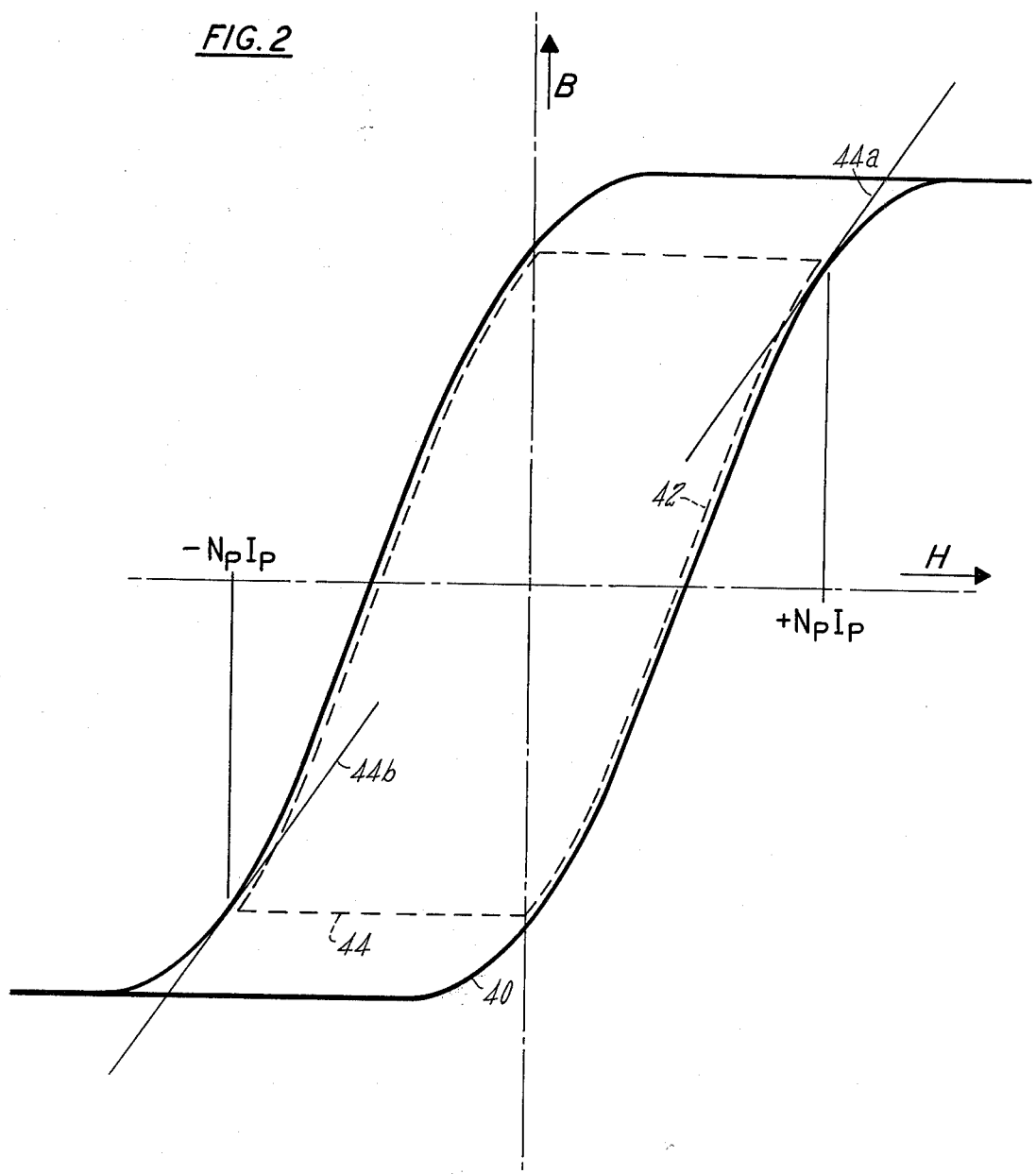
FIG. 2 is a graphical illustration of a typical current transformer core B-H curve and a representative B-H operating loop produced by the circuit of FIG. 1 in the absence of low frequency primary current excitation.

In FIG. 2, there is depicted a solid line B-H curve 40 for current transformer core 12 in FIG. 1 which has been idealized to a relatively square loop to emphasize the operating principles of the present invention. Also depicted is a dashed line B-H curve 42 representing the operating loop over which core 12 is exercised by the inverter which, as seen from the pulse wave 22 in FIG. 4, functions as a square wave oscillator driving voltage source. Since transistor Q3 uniformly switches the inverter when the secondary winding exciting current, waveform 24 in FIG. 4, achieves the current level 34 ($I_p$), the core, for the symmetrical B-H operating loop 42 illustrated in FIG. 2, is excited to uniformly equal positive and negative peaks of magnetomotive force H or ampere turns ($+NI_p$ and $-NI_p$), where N equals the turns in each half of secondary winding 12. This peak current is selected such that the peak magnetomotive force ($\pm NI_p$) exceeds the core coercive force, but falls just short of driving core 12 into saturation, as illustrated in FIG. 2. Thus, the peaks of the resulting flux wave occur in the regions of the B-H operating loop 42 where the permeability of the core is beginning to decrease with the increasing flux. The inductance of the secondary winding driving core 12 can be expressed as $$L = N(d\Phi/dI)$$

Thus, inductance is proportional to the slope of the B-H curve, i.e., core permeability, which, from FIG. 2, is seen to change markedly over operating loop 42; the most dramatic changes occurring in the regions approaching the flux wave peaks. Line 44a in FIG. 2 represents the slope of the B-H curve in this region approaching the positive flux peak or positive-going exciting current peak $I_p$, while line 44b represents the curve slope in the corresponding region approaching the negative flux peak. For any soft magnetic core material, the core permeabilities in these regions are identical, as represented by the corresponding slopes of lines 44a and 44b.

The voltage across an inductor can be expressed as $$V = L \, di/dt,$$

and thus inductance can be expressed as $$L = V \, dt/di.$$

Since secondary winding 12 is driven by the square wave inverter source, the voltage V is this equation is a constant. If the quantity di is defined as the current increment between levels 28 and 32 in FIG. 4, also a constant, then the time increment dt becomes a measure of the secondary winding inductances. From FIG. 4, it is seen that time increments dt1 correspond to the duration of transistors Q4 collector voltage pulses 30a, and time increments dt2 correspond to the duration voltage pulses 30b. Thus, the duration of pulses 30a is indicative of the average core inductance over the current increment di (current level 32 minus current level 28) just below the positive exciting current peaks $+I_p$ (current level 34), while the duration of pulses 30b is indicative of the average core inductance over the identical current increment correspondingly just below the negative exciting current peaks $-I_p$. Thus, as depicted in FIGS. 2 and 4, durations of pulses 30a and 30b are equal, as are the slopes of lines 44a and 44b. This situation exists as long as current transformer 10 is not excited by primary current, i.e., no imbalance in the currents flowing in the line and neutral conductors L and N of FIG. 1.

Figure 3:
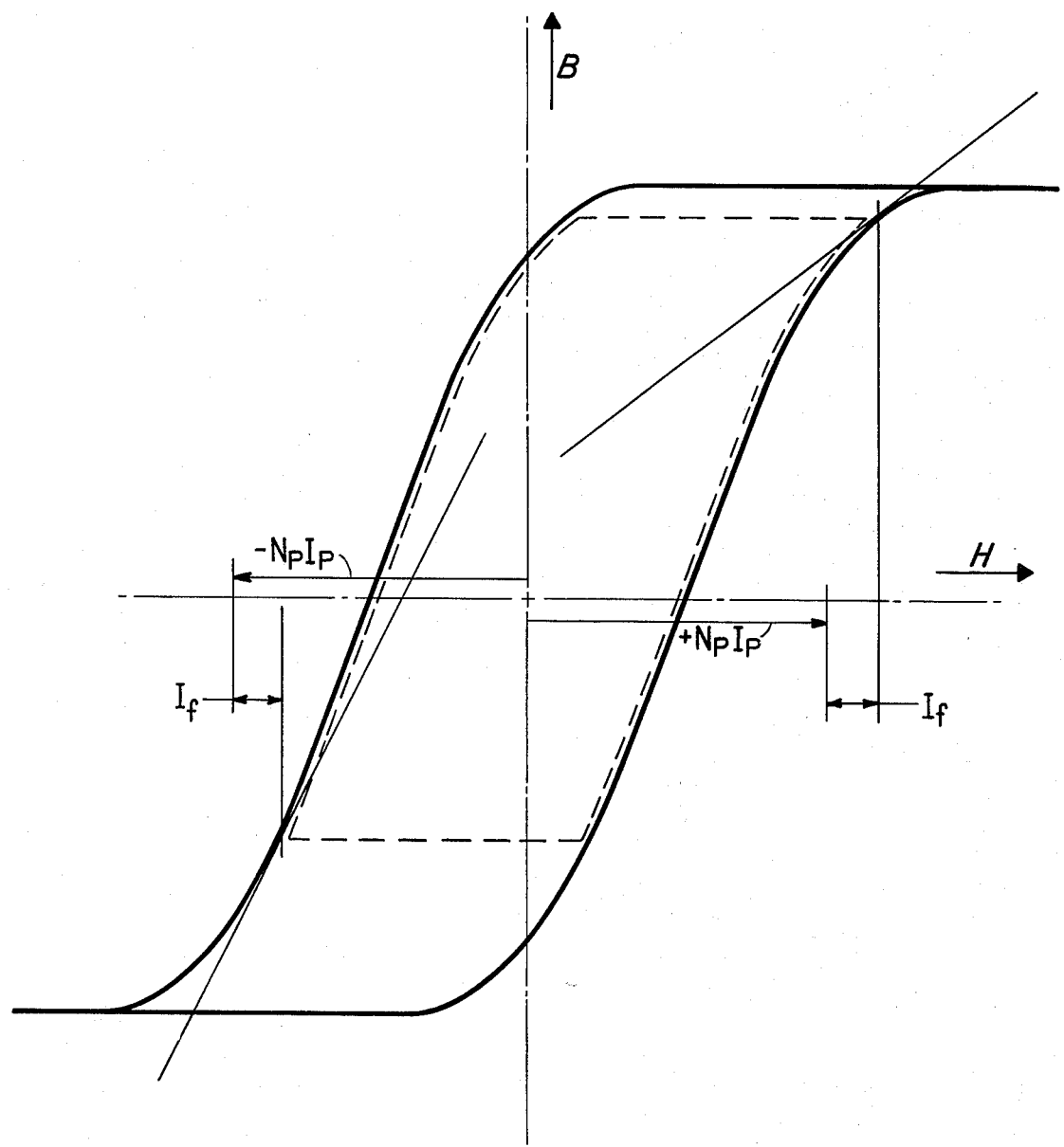
FIG. 3 is a graphical illustration of the core B-H curve of FIG. 2 in conjunction with a representative B-H operating loop produced by the circuit of FIG. 1 in the presence of primary current excitation.

Upon the existence of a current imbalance in the line and neutral conductors, a small additional magnetomotive force (MMF), less than the core coercive force, is induced into core 12. This situation is depicted in FIG. 3. Since the frequency of the peak current controlled inverter is high, e.g., 25,000 Hertz, relative to a 60 Hertz net primary current, this additional MMF, may be illustrated as being produced by a DC net primary current $I_f$. From FIG. 3 it is seen that the net effect of this additional MMF ($I_f$, assuming single-turn primary windings) is to disturb the symmetry of the B-H operating loop, indicated at 45 in FIG. 3, with respect to B-H curve 40. That is, the operating loop 45 is seen to be shifted along the H axis. Assuming a positive $I_f$, the B-H operating loop 45, over which the core is exercised by the inverter, is shifted rightwardly and upwardly on the core's B-H curve 40. This is seen from the fact that the MMF of current $I_f$ adds to the inverter generated MMF ($+NI_p$) during positive half cycles and subtracts from the inverter generated MMF ($-NI_p$) during negative half cycles. Consequently, the net positive MMF drives the core into near positive saturation, as compared to the situation depicted in FIG. 2, and the slope of the B-H curve in the region approaching the positive flux wave peaks decreases significantly, as indicated by the slope of line 46a. On the other hand, the negative flux wave peaks are further removed from the core's negative saturation level, and the slope of the B-H curve in the region approaching the negative flux wave peaks increases significantly, as indicated by the slope of line 46b. It is therefore apparent that the core permeabilities in these two regions are no longer equal. It is also apparent that the difference between these core permeabilities is indicative of the magnitude of the primary current excitation $I_f$.

Figure 5:
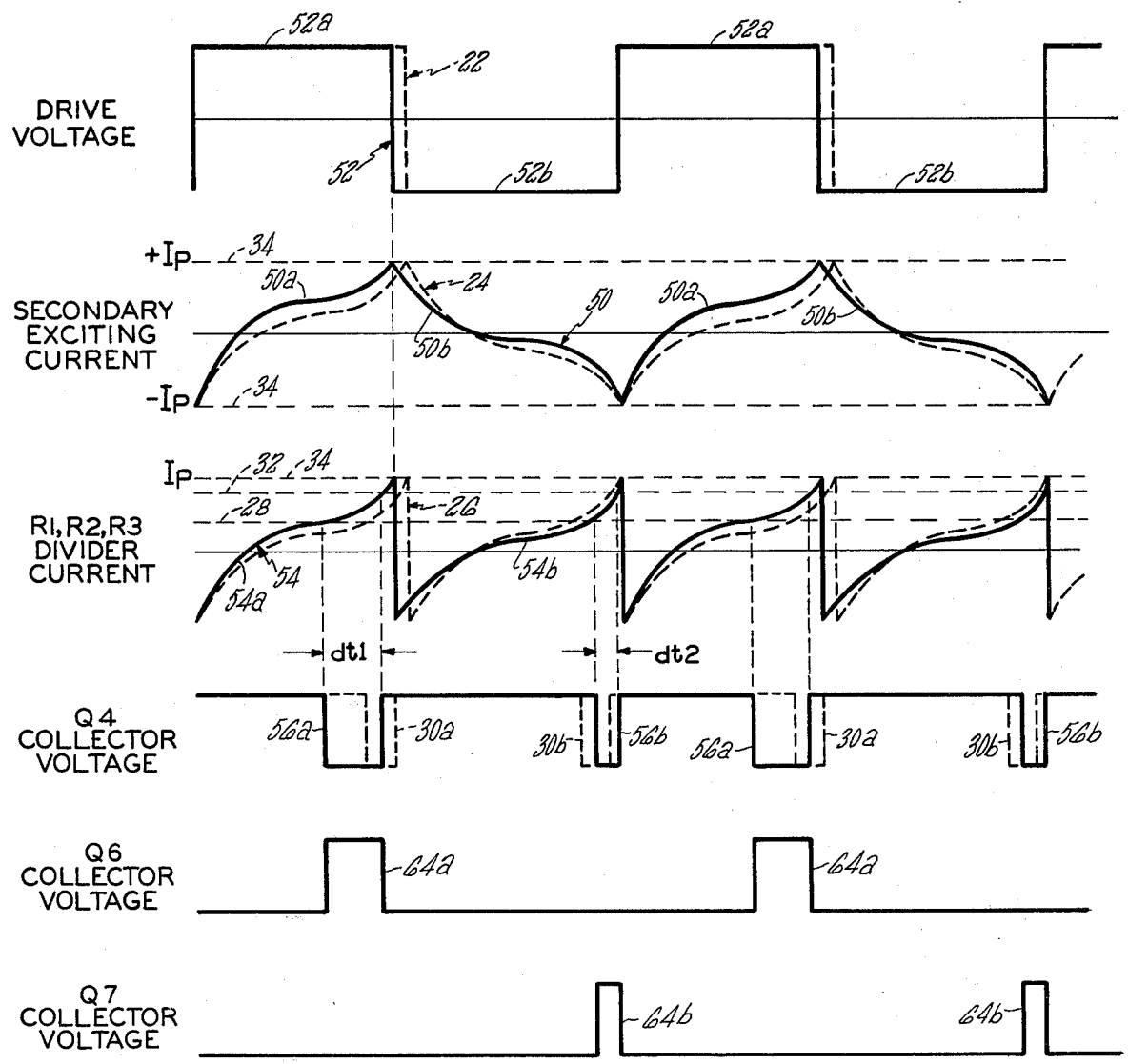
FIG. 5 is a series of voltage and current waveforms useful in understanding the operation of the circuit of FIG. 1 in the presence of primary current excitation.

Turning to FIG. 5, the effects of the net primary current $I_f$ disturbance on the current and voltage waveforms in the circuit of FIG. 1 are illustrated in solid line, and, for ease of comparison, the current and voltage waveforms of FIG. 4 are reproduced in dashed line. Because of the shift in the B-H operating loop 45 (FIG. 3) caused by the primary current $I_f$, the positive half cycle current curves 50a of exciting current waveform 50 achieve the inverter switching current threshold 34 in less time than did the current curves 24a of FIG. 4 in the absence of net primary current excitation. Thus, the durations of the positive pulses 52a of the drive voltage square wave 52 are correspondingly shortened, as illustrated in FIG. 5. More time is required for the negative half cycle current curves 50b to achieve the inverter switching current threshold 34, and thus the durations of the negative drive voltage pulses 52b are expanded to maintain the same period for the drive voltage. Consequently, the inverter frequency is essentially unaffected by a primary current disturbance. From waveform 54 of the resistors R1, R2, R3 divider current, it is seen that the positive-half cycle current curves 54a achieve current threshold level 28 considerably sooner in time and that the time increment dt1 required to then achieve threshold level 32 is expanded, as compared to the situation illustrated in FIG. 4. Consequently, the durations of the voltage pulses 56a generated at the collector of transistor Q4 during the inverter positive half cycles are greater than the durations of voltage pulses 30a. Conversely, more time is required for the negative half cycle current curves 54b to achieve the threshold levels 28 and 34, but the times increments dt2 are compressed, as are the durations of the transistor Q4 collector voltage pulses 56b. It is thus seen from FIG. 5 that the presence of any net primary current excitation of transformer 10 has a marked effect on the relative durations of pulses appearing at the collector of transistor Q4 during the positive and negative half cycles of the inverter. While the primary current excitation $I_f$ has been shown in FIG. 3 as having a positive polarity, it will be appreciated that for a 60 Hertz primary current excitation, the current $I_f$ will alternate between positive and negative polarities at a very slow rate as compared to the inverter frequency. When the polarity of the primary current $I_f$ is negative, transistor Q4 collector voltage pulses 56b will be expanded in time and voltage pulses 56a compressed.

The remainder of the circuitry illustrated in FIG. 1, now to be described, is devoted to processing these voltage pulses pursuant to developing an output signal indicative of the magnitude of the primary current $I_f$. Thus, the collector of transistor Q4 is connected to a phase discriminating network, generally indicated at 60, operating to sort these voltage pulses according to inverter half cycles. Specifically, the collector of transistor Q4 is connected through a resistor R7 to the base of a transistor Q6 and through a resistor R8 to the base of a transistor Q7. The right side of secondary winding 14 is connected through a diode D1 and a resistor R9 to the base of transistor Q6, while the left side of the secondary winding is connected to the base of transistor Q7 through a diode D2 and a resistor R10. The base of transistor Q6 is also connected to positive voltage bus 16 through a resistor R11 and a diode D3, and similarly the base of transistor Q7 is connected to bus 16 through a resistor R12 and a diode D4. The emitters of transistors Q6 and Q7 are both connected to bus 16, while their collectors are respectively connected to ground bus 18 through series resistors R13 and R14 and through series resistors R15 and R16.

When transistor Q2 is switched on and transistor Q1 switched off by switching control network 20, the voltage at the right side of secondary winding 14 falls below the positive supply voltage on bus 16, while the voltage at the left side of the primary winding, by virtue of transformer action, goes to substantially twice supply voltage. In the latter case, the twice supply voltage is coupled through diode D2 and resistor R10 to the base of transistor Q7, and diode D4 operates to clamp the base of this transistor at a voltage which is one diode voltage drop above the supply voltage on bus 16. Under these circumstances, transistor Q7 is cut off for the duration of each inverter half cycle in which transistor Q2 is conductive and transistor Q1 is non-conductive. On the other hand, the less than supply voltage at the right side of secondary winding 14 during these inverter half cycles allows the base voltage on transistor Q6 to drop sufficiently below the supply voltage on bus 16 to turn this transistor on when transistor Q4 goes into conduction. Consequently, voltage pulses appear at the collector of transistor Q6 having the same durations as the transistor Q4 collector voltage pulses 30a or 56a, FIGS. 4 and 5. These transistor Q6 voltage pulses, seen at 62a in FIG. 4 and 64a in FIG. 5, produce corresponding current pulses through resistors R13 and R14. During the other inverter half cycles when transistor Q1 is conductive and transistor Q2 non-conductive, transistor Q6 is cut off and transistor Q7 is enabled in the same manner to produce collector voltage pulses 62b and 64b (FIGS. 4 and 5), which are replications of the transistor Q4 collector voltage pulses 30b and 56b. These transistor Q7 collector voltage pulses drive corresponding current pulses through resistors R15 and R16.

The current pulses through resistor R14 are integrated by a capacitor C1 to develop an averaging voltage at a junction 61 for application through a resistor R17 to the inverting input of a differential amplifier 62. Similarly, the current pulses through resistor R16 are integrated by a capacitor C2 to develop an averaging voltage at a junction 63 for application through a resistor R18 to the non-inverting input of amplifier 62. Since the frequencies and the amplitudes of the two current pulse trains flowing respectively through resistors R13 and R15 are equal, the averaging voltages developed at junctions 61 and 63 provide a measure of the relative widths of the pulses thereof. Thus in the situation of no primary current excitation depicted in FIG. 4, the width of pulses 62a are equal to the width of pulses 62b, as are the widths of the current pulses through resistors R13 and R15. Consequently, the averaging voltages developed at junctions 61 and 63 are also equal, and no current flows in the output circuit of differential amplifier output, which, as seen in FIG. 1, is connected to one side of a transformer tertiary winding 66. The other side of this winding is connected to the junction 68 between resistors R19 and R20 connected in series between buses 16 and 18. This junction is connected to an output terminal 70 through a resistor R21, which, in conjunction with capacitor C3, provide a low pass filter. Resistor R17 and capacitor C4 provide high frequency filtering for the inverting amplifier input, while capacitor C5 and resistor R18 serve the same purpose for the non-inverting amplifier input.

When this balanced condition is disturbed by the presence of a net primary current $I_f$, the averaging voltages at junctions 61 and 63 are no longer equal, and amplifier generates a feedback current $I_r$ which flows through tertiary or feedback winding 66. The feedback current automatically assumes the requisite magnitude and phase necessary to equalize the voltages at junctions 61 and 63. It is seen that in order to achieve this, the feedback current excitation $I_r$ must effectively offset or null the primary current excitation $I_f$ such that the B-H operating loop 46 of FIG. 3 is shifted back to the symmetrical position on B-H curve 40 of operating loop 44 in FIG. 2. Under these circumstances, the durations of pulses 62a and 62b become equal, as do the averaging voltages at junctions 61 and 63. The magnitude of the feedback current $I_r$ thus becomes a precise measure of the primary current $I_f$ and is reflected in the voltage appearing at output terminal 70. Since this output voltage can be made relatively large as compared to conventional approaches to developing secondary signal voltages proportional to low level primary current excitation, the processing electronics for handling the signal can be less sophisticated and have low gains to reduce sensitivity to externally imposed noise. Thus, in personnel ground fault protective devices, wherein the output voltage at terminal 70 would be processed pursuant to initiating a ground fault trip function, nuisance tripping can be more readily avoided. Since the output voltage signal is determined on the basis of the differential core inductance, variations in the core characteristics and circuit element parameters are automatically cancelled.

Although it was stated, for the purposes of explanation, that the primary current $I_f$ induced a small additional MMF beyond that induced by the inverter, this is not a basic operational limitation. Since any net primary current which flows will be nulled by the tertiary current, the magnitude of primary current excitation which can be measured is limited only by the magnitude of tertiary winding current available to restore the transformer core to balanced operation.

It will thus be seen that the objects set forth above, among those made apparent in the preceding description, are efficiently attained and, since certain changes may be made in the above construction without departing from the scope of the invention, it is intended that all matter contained in the above description or shown in the accompanying drawings shall be interpreted as illustrative and not in a limiting sense.

Having described our invention, what we claim as new and desire to secure by Letters Patent is:

1. Apparatus for sensing low level primary current excitation of a current transformer, said apparatus comprising, in combination:
   A. an AC voltage source connected to drive a secondary winding of the current transformer at a frequency greater than the frequency of the primary current excitation to produce a secondary winding exciting current having alternating positive and negative peaks of equal and uniformly constant amplitudes insufficient to saturate the current transformer core, said secondary exciting current producing a flux wave in the core having alternating positive and negative peaks;
   B. inductance sensor means responsive to said secondary winding exciting current for developing a first signal proportional to the inductance of the secondary winding as the core flux wave approaches each positive peak and a second signal proportional to the secondary winding inductance as the flux wave approaches each negative peak;
   C. means responsive to the differential of said first and second signals for developing an output signal proportional to the primary current excitation.

2. The apparatus defined in claim 1, wherein said AC source is a peak current controlled inverter.

3. The apparatus defined in claim 1, wherein said inductance sensor means includes threshold detector means establishing first and second threshold levels for said secondary exciting current and operating to generate a first pulse during each positive half cycle having a width equal to the time required for the secondary exciting current to rise from said first threshold level to said second threshold level en route to each positive peak and a second pulse during each negative half cycle having a width equal to the time required for the secondary exciting current to rise from said first threshold level to said second threshold level en route to each negative peak.

4. The apparatus defined in claim 3, wherein said inductance sensor means further includes phase discriminating means controlled from said AC source and connected to said threshold detector means for sorting out said first and second pulses into respective first and second pulse trains.

5. The apparatus defined in claim 4, wherein said inductance sensor means further includes
   (1) first means for integrating said first pulse train to develop said first signal proportional to the average duration of said first pulses, and
   (2) second means for integrating said second pulse train to develop said second signal proportional to the average duration of said second pulses.

6. The apparatus defined in claim 5, wherein said first and second signal differential responsive means includes a differential amplifier to which said first and second signals are connected as separate inputs.

7. The apparatus defined in claim 6, wherein said signal differential responsive means further includes a feedback winding on the current transformer core, said differential amplifier connected to drive a feedback current through said feedback winding automatically effective to null out the primary current excitation in the process of equalizing said first and second signals.

8. The apparatus defined in claim 7, wherein said signal differential means further includes means responsive to said feedback current for developing said output voltage.

9. The apparatus defined in claim 1, wherein the current transformer is a differential current transformer having plural primary windings, and the primary current excitation is equal to the imbalance in the currents flowing in the primary windings.

10. Apparatus for sensing low frequency primary current excitation of a current transformer having a closed magnetic core of soft magnetic material, said apparatus including, in combination:
    A. an AC voltage source connected to drive high frequency exciting current through a secondary winding on the core and thereby exercise the core over an operating loop of the core's B-H curve, said exciting current having alternating positive and negative peaks of uniformly equal amplitudes insufficient to saturate the core,
       (1) said operating loop being symmetrical with respect to the positive and negative saturation levels of the core's B-H curve in the absence of primary current excitation, and
       (2) in the presence of primary current excitation, said operating loop being shifted on the core's B-H curve such that it is no longer symmetrical with respect to the positive and negative saturation levels;
    B. means responsive to said secondary exciting current for developing a first signal proportional to the average slope of said operating loop over a first region thereof during the positive half cycle of the flux wave generated in the core by said secondary exciting current and a second signal proportional to the average slope of said operating loop over a corresponding second region thereof during the negative half cycle of the flux wave, the slopes of said operating loop over said first and second regions being equal in the absence of primary current excitation; and
    C. means responsive to the differential of said first and second signals for developing an output signal proportional to the primary current excitation.

11. The apparatus defined in claim 10, wherein said first and second signal differential responsive means includes a tertiary winding on the current transformer core and means for driving a current through said tertiary winding to drive the differential of said first and second signals to zero by shifting said operating loop back to its symmetrical position with respect to the positive and negative saturation levels of the core's B-H curve.

12. The apparatus defined in claim 11, wherein said signal differential responsive means further includes means for sensing said tertiary winding current pursuant to developing said output signal.

13. The apparatus defined in claim 12, wherein the current transformer is a differential current transformer having plural primary windings, and the primary current excitation is equal to the imbalance in the currents flowing in the primary winding.

* * * * *